United States Patent

Haddad et al.

[11] Patent Number: 5,491,657
[45] Date of Patent: Feb. 13, 1996

[54] METHOD FOR BULK (OR BYTE) CHARGING AND DISCHARGING AN ARRAY OF FLASH EEPROM MEMORY CELLS

[75] Inventors: Sameer S. Haddad, San Jose; Hao Fang, Cupertino, both of Calif.

[73] Assignee: Advanced Micro Devices, Inc., Sunnyvale, Calif.

[21] Appl. No.: 393,636

[22] Filed: Feb. 24, 1995

[51] Int. Cl.$^6$ ................................................. G11C 11/40
[52] U.S. Cl. ............................ 365/185.27; 365/185.18; 365/185.26; 365/185.09; 365/185.3
[58] Field of Search .................................... 365/185, 218; 257/316

[56] References Cited

U.S. PATENT DOCUMENTS

| | | | |
|---|---|---|---|
| 4,451,905 | 5/1984 | Moyer | 365/185 |
| 5,021,999 | 6/1991 | Kohda et al. | 365/185 X |
| 5,077,691 | 12/1991 | Haddad et al. | 365/218 |
| 5,084,843 | 1/1992 | Mitsuishi et al. | 365/218 |
| 5,349,220 | 9/1994 | Hong | 365/185 X |
| 5,349,553 | 9/1994 | Yamada et al. | 365/185 |
| 5,357,463 | 10/1994 | Kinney | 365/185 |

*Primary Examiner*—David C. Nelms
*Assistant Examiner*—Son Dinh
*Attorney, Agent, or Firm*—Davis Chin

[57] ABSTRACT

There is provided an improved method for bulk (or byte) programming an array of flash EEPROM memory cells. A negative voltage is applied to the substrate of the array. A reference voltage of zero volts is applied simultaneously to the drain regions of selected memory cells that are to be programmed. There is also applied simultaneously the same reference voltage of zero volts to the control gates of the selected memory cells. The present invention provides for low current consumption and fast programming of the memory cell, which require only a single, low voltage power supply. The endurance reliability is greater than 100,000 cycles.

23 Claims, 6 Drawing Sheets

METHOD FOR BULK (OR BYTE) CHARGING AND DISCHARGING AN ARRAY OF FLASH EEPROM MEMORY CELLS

BACKGROUND OF THE INVENTION

1. Field of the Invention

This invention relates generally to floating gate memory devices such as an array of flash electrically erasable and programmable read-only memory devices (EEPROMs). More particularly, the present invention relates to an improved method for bulk (or byte) programming a flash EEPROM device having a floating gate structure.

2. Description of the Prior Art

As is generally known in the art, there exists a class of non-volatile memory devices referred to as "flash EEPROMs" which has recently emerged as an important memory device by combining the advantages of EPROM density with EEPROM electrical erasability. Such flash EEPROMs provide electrical erasing and a small cell size. The operation and structure of such flash EEPROMs is discussed in U.S. Pat. No. 5,077,691 to Sameer S. Haddad et al. issued on Dec. 31, 1991, which is assigned to the same assignee as in the present invention and is hereby incorporated by reference in its entirety. The '691 patent discloses a flash EEPROM cell array which is erased by applying a zero reference voltage to the bulk substrate of the cell, a relatively high negative voltage to the control gate of the cell, and a relatively low positive voltage to the source region of the cell. During the sector-programming mode of operation, a relatively high positive voltage (i.e., +12 V) is applied to the control gates via wordlines of the selected sectors while zero volts are applied to the control gates of the memory cells in the non-selected sectors. Further, the source regions of all transistors in the selected sectors are connected to a ground potential of zero volts, and the drain regions thereof are raised to an intermediate high positive level of approximately +6.5 volts.

Another discussion regarding the operation and structure of flash EEPROM devices is described in U.S. Pat. No. 5,126,808 to Antonio J. Montalvo et al. issued on Jun. 30, 1992, which is assigned to the same assignee as in the present invention and is also hereby incorporated by reference in its entirety. In the '808 patent, there is disclosed a flash EEPROM array with page erase architecture in which a selected page of the memory array can be erased and replaced with new data without affecting the other pages of the memory array. Erasure of a flash EEPROM cell in the array is accomplished by use of a negative voltage on the control gate of the EEPROM cell.

Each of the plurality of flash EEPROM cells may be formed on a semiconductor substrate, typically of a p-type conductivity. Drain and source regions are formed in the upper portions of the p-type substrate by using a diffusion method such as ion-implantation technique with an n-type dopant of arsenic or phosphorus. The formation of the n-type drain and source regions define a channel region on the p-type substrate. A tunneling oxide film is formed on the channel region in the p-type substrate. A conductive polysilicon floating gate is formed on the tunneling oxide film. An interpoly dielectric is formed on the floating gate. A polysilicon control gate is insulatively formed on the interpoly dielectric.

According to conventional operation, the flash EEPROM cell is erased by applying a positive voltage to the source region while the control gate is grounded or biased to a negative voltage. In flash EEPROM arrays, all of the cells therein are usually erased in bulk (i.e., either the entire chip or by sectors each having a large number of floating gate transistors). This is due to the fact that their source regions are all tied to a common source line. On the other hand, the flash EEPROM cell is programmed by applying a relatively high voltage to the control gate and a moderately high voltage to the drain region. The source region is connected to a ground potential.

A number of disadvantages may be encountered with the conventional way in which the flash EEPROM cells are programmed. One drawback is because of the different voltages required to be applied to the control gates and source regions (i.e., +12 V and +6 V) during programming. Thus, it is frequently necessary to provide at least two power supplies for generating these voltages. Further, the magnitude of the programming current tends to be relatively high, on the order of approximately 400 µA per cell. As a consequence, the power requirement of a memory chip having one million or more memory cells (a one megabit chip) can be excessive. There has been a long felt need in the industry to develop a flash EEPROM chip which can be operated by only a single, low voltage power supply (i.e., $\mp$V) that has a low current requirement (i.e., 1 µA per cell).

The second drawback of the conventional programming technique arises from the fact that a relatively high field is generated between the drain and the substrate during programming (p-type substrate has 0 V applied and the n-type drain region is at +6 V). As a result, there may be caused high energy holes ("hot" holes generated by a so-called "impact ionization") to be formed at the surface portion of the channel near to the drain-to-substrate junction, thereby producing damage thereto so as to cause severe degradation in its performance and reliability.

A third drawback associated with the conventional programming technique is that the bulk programming time is relatively long. For the conventional method (using hot-carrier injection), the byte programming is less than 10 µS. However, there is needed to be programmed thousands of bytes (i.e., 64K bytes for a sector size of 512K bits). Further, this is done serially. Thus, the total programming time for the whole sector will be in the order of a second. It would therefore be desirable to provide an EEPROM chip which has a relatively fast bulk programming time for the whole sector, on the order of less than 100 µS.

As is generally known, the substrate is typically common for the core devices and the peripheral circuitry. In order to have the capability of applying a substrate voltage to the cells in the core array but yet maintain the substrate at an independent potential, typically at 0 volts, the core array will be located inside a large p-well area. For example, such use of a p-well area is demonstrated in a memory array architecture which is known in the prior art and is sometimes referred to as DINOR (divided bit line NOR) flash memory. For a more detailed discussion of this DINOR type architecture, reference is made to an IEEE paper entitled "Memory Array Architecture and Decoding Scheme for 3 V Only Sector Erasable DINOR Flash Memory" by Shin-ichi Kobayashi et al., IEEE Journal of Solid-State Circuits, Vol. 29, No. 4, April, 1994, pp. 454–460. This article is incorporated herein by reference.

As defined herein, the term "charging" refers to placing negative charges on the floating gate and is typically referred to a "programming." The term "discharging" refers to extracting negative charges from the floating gate and is typically referred to as "erasing." However, for the DINOR type architecture the term "charging" is used to mean "erasing" since it is a bulk operation and the term "discharging" is used to mean "programming." In the above-mentioned article, there is described a bulk charging method for the memory array using Fowler-Norheim tunneling which requires a high field to be applied to the cell. In other words, the voltage condition of the DINOR cell in the erase operation for the selected sector is +10 V on the word lines (control gates) and −8 V on the p-well and the sources. However, this technique suffers from the disadvantages of high voltages and slow bulk charging.

SUMMARY OF THE INVENTION

Accordingly, it is a general object of the present invention to provide an improved method for bulk (or byte) programming a flash EEPROM device having a floating gate structure which overcomes the disadvantages of the prior art programming methods.

It is an object of the present invention to provide an improved method for bulk (or byte) programming an array of flash EEPROM memory cells which requires only a single, low voltage power supply and has a lower power consumption as compared to that of the prior art.

It is another object of the present invention to provide an improved method for bulk (or byte) programming an array of flash EEPROM memory cells which requires a smaller programming current and has a relatively fast programming time than those traditionally available.

It is still another object of the present invention to provide an improved method for bulk (or byte) programming an array of flash EEPROM memory cells which is realized by applying a negative voltage to the substrate of the array and applying simultaneously zero volts to the drain regions and control gates of selected memory cells in the array that are to be programmed.

In a preferred embodiment of the present invention, there is provided a method for bulk (or byte) programming an array of flash EEPROM memory cells, the array being formed on a substrate to define columns and rows, where the substrate includes a common source line extending along at least one of the rows, a common substrate line, and a plurality of bit lines extending along respective columns. Each of the memory cells includes an n-type source region coupled to the common source line, a control gate, a floating gate, a channel region, and an n-type drain region coupled to a respective one of the bit lines. The bulk (or byte) programming is achieved by applying a negative voltage to the substrate of the array. Simultaneously, there is applied a reference voltage of zero volts to the drain regions of the selected memory cells in the array that are to be programmed. Further, there is applied simultaneously the same reference voltage of zero volts to the control gates of the selected memory cells.

In another aspect of the present invention, there is provided a method for bulk (or byte) programming and source-side erasing an array of flash EEPROM memory cells. In still another aspect of the present invention, there is provided a method for bulk (or byte) programming (charging) and bulk (or byte) erasing (discharging) an array of flash EEPROM memory cells.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

It is to be distinctly understood at the outset that the present invention shown and described in association with an EEPROM device is not intended to serve as a limitation upon the scope or teachings thereof, but is merely for the purpose of convenience of illustration of one example of its application. The present invention has also applications for EPROM, DINOR type cell architecture, or any device having a control gate capacitively coupled to a floating gate structure with a junction that can be made to break down since the invention pertains to a unique method of charging which is relatively fast and has a relatively low operational voltage.

Figure 1:
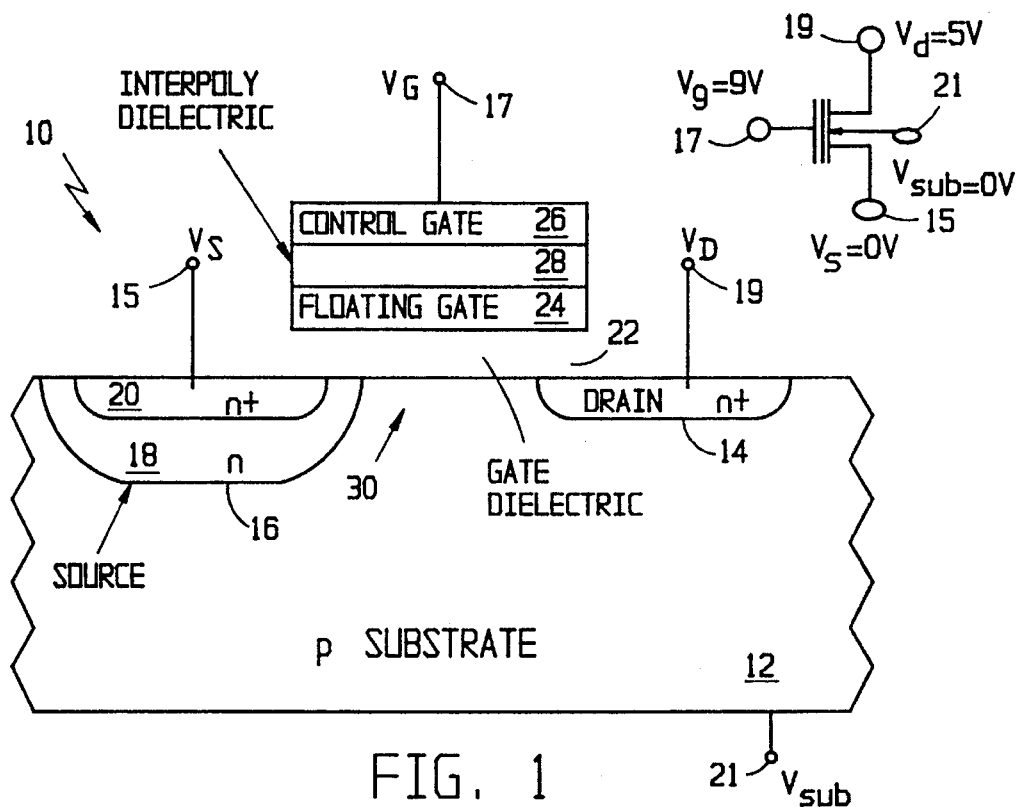
FIG. 1 shows a cross-sectional view of a flash EEPROM cell having a floating gate structure to which the present method of bulk (or byte) programming can be applied.

The present invention provides an improved method for bulk (or byte) programming an array of flash electrically erasable and programmable read-only memory (EEPROM) device having a floating gate structure in which each cell thereof has the same structure as that of the prior art as illustrated in FIG. 1. FIG. 1 illustrates a conventional flash EEPROM cell or device 10. It is to be understood that a large number, N×M (i.e., 1,000 or more), of such cells 10 are typically formed as a part of a single integrated circuit chip (not shown) and arranged in an N×M matrix. An external or off-chip single, low voltage power supply, which is typically at +3.0 V, is supplied to the integrated circuit chip.

The array of the flash EEPROM memory cells is formed on a substrate to define columns and rows, where the substrate includes a common source line extending along at least one of the rows, a common substrate line, and a plurality of bit lines extending along respective columns. Each of the memory cells include an n-type source region coupled to the common source line, a control gate, a floating gate, a channel region, and an n-type drain region coupled to a respective one of the bit lines.

In particular, as can be seen from FIG. 1, the EEPROM cell 10 is formed of a substrate 12, typically of a p-type conductivity having embedded therein an n+ drain region 14 and an n-type double-diffused source region 16. The double-diffused source region 16 is formed of a deeply diffused but lightly doped n-junction 18 (phosphorus doped) and a more heavily doped but shallower n+ junction 20 (arsenic doped) embedded within the deep n-junction 18. A relatively thin gate dielectric 22 (i.e., oxide of approximately 100 Å thickness) is interposed between the top surface of the substrate 12 and a conductive polysilicon floating gate 24. The polysilicon control gate 26 is insulatively supported above the floating gate 24 by an interpolydielectric layer 28. A channel region 30 in the substrate 12 separates the drain region 14 and the source region 16.

Further, there is provided a terminal pin 15 for applying a source voltage $V_S$ to the source region 16. A terminal pin 17 is provided for applying a gate voltage $V_G$ to the control gate 26. A the terminal pin 19 is provided for a applying drain voltage $V_D$ to the drain region 14. Finally, a terminal pin 21 is provided for applying a substrate voltage $V_{sub}$ to the substrate 12.

With reference to the programming inset of FIG. 1, there is shown a schematic representation for the conventional programming operation. The flash EEPROM cell of FIG. 1 is programmed by applying a relatively high voltage $V_G$ (approximately +9 volts) to the control gate 26 via the terminal pin 17 and a moderately high voltage $V_D$ (approximately +5 volts) to the drain region 14 via the terminal pin 19. The source region 16 is connected to a ground potential ($V_S$=0) via the terminal pin 15. The substrate 12 is also connected to the ground potential ($V_{sub}$=0) via the terminal pin 21.

Figure 10:
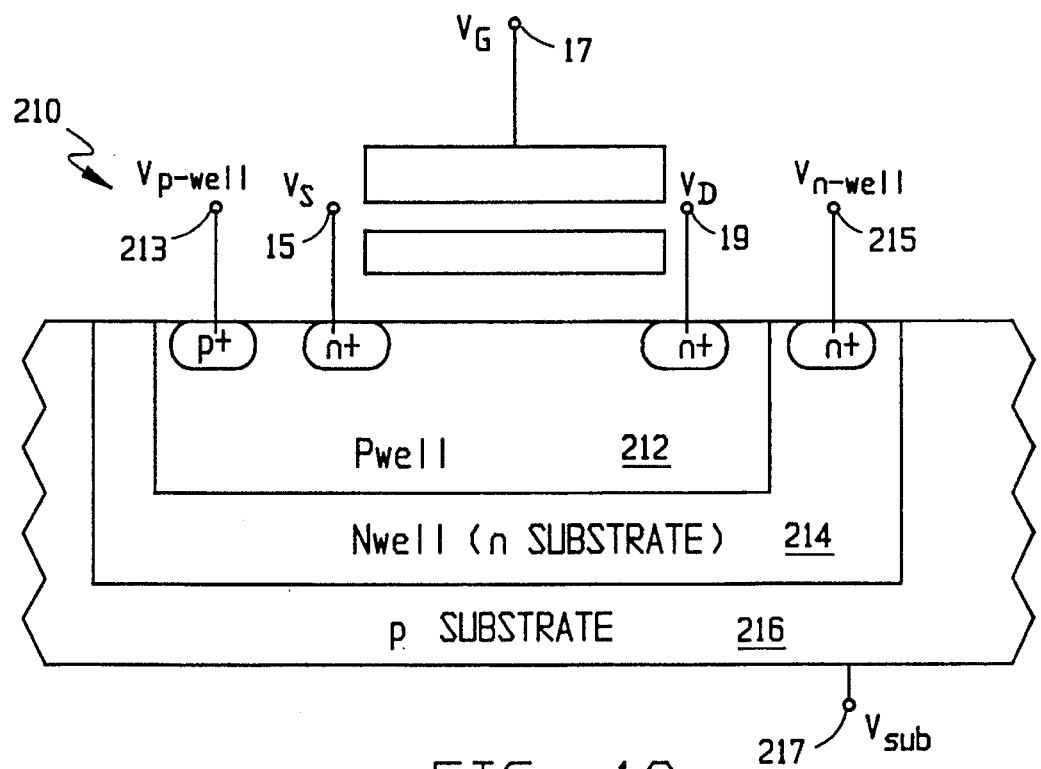
FIG. 10 shows a cross-sectional view of a flash memory cell in a p-well area having a floating gate structure to which the present method of bulk (or byte) programming can be applied.

Alternatively, there is shown in FIG. 10 a cross-sectional view of a flash memory cell 210 formed in a p-well area having a floating gate structure. As was previously pointed out, this architecture permits the application of a substrate voltage to the cells in the core array when it is desired to have the substrate potential kept at an independent potential. It will be noted that the cell 210 is substantially identical to the EEPROM cell 10 of FIG. 1, except that the core cell 210 is formed in a large p-well 212 rather than in the p-type substrate 12. Thus, the p-well 212 is functionally equivalent to the substrate 12. Further, the p-well 212 is located with an n-well 214 that is disposed in the bulk substrate 216. A terminal pin 213 is provided for applying a p-well voltage $V_{p-well}$ ($V_{sub}$) to the p-well 212. A terminal pin 217 is provided for applying a bulk substrate voltage $V_B$ to the bulk substrate 216. Finally, a terminal pin 215 is provided for applying an n-well voltage $V_{n-well}$ to the n-well 214. Except for these differences, the two cells 10 and 210 are identical in their construction and operation.

Before describing in detail the improved method for flash programming an array of flash EEPROM memory cells according to the present invention, it is believed that it would be helpful in understanding the principles of the instant invention and to serve as a background by first explaining the investigations performed and the results of the experimentation observed by the inventors.

Figure 2:
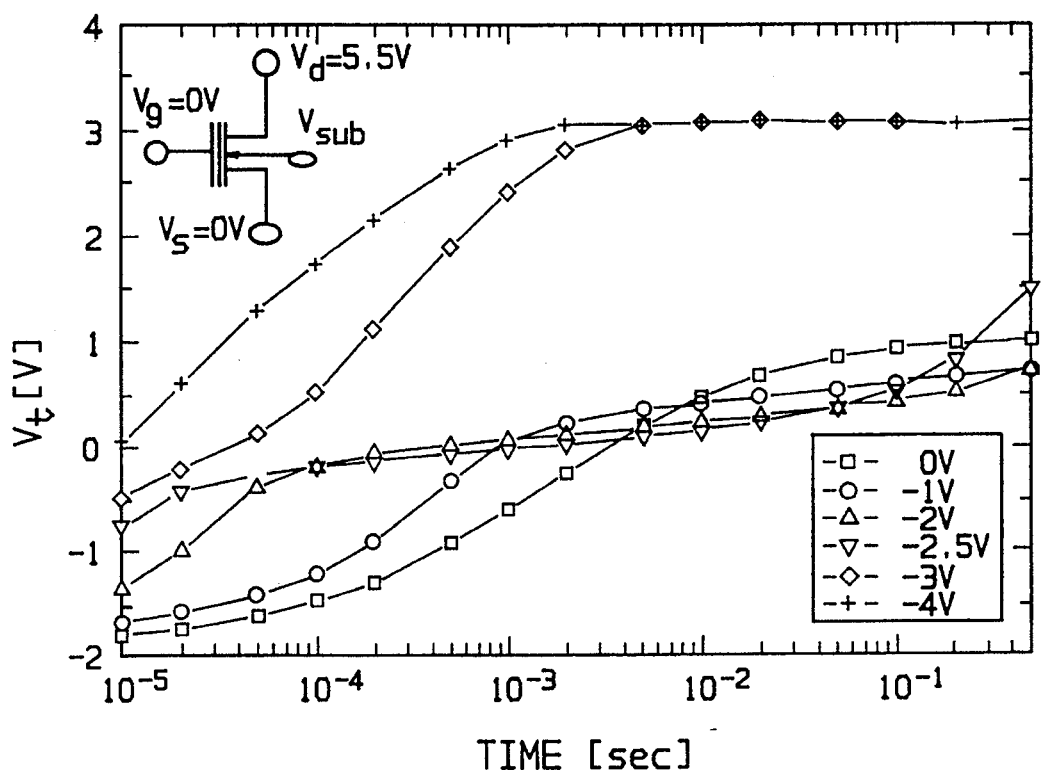
FIG. 2 illustrates the APD dependence on the voltage applied to the substrate.

Initially, the inventors conducted an investigation to explain the dependence of the self-convergence point on the voltage applied to the drain voltage during automatic programming disturb (APD). As used herein, the term "automatic program disturb" refers to soft programming of the unselected cell during programming of the other cells on the same bit line. To demonstrate the APD dependence on the voltage applied to the substrate, the threshold voltages $V_t$ of a memory cell is plotted as a function of time in FIG. 2 with the fixed drain voltage $V_d$=+5.5 V and with six different substrate voltages $V_{sub}$ as defined in the inset. It will be noted that at $V_{sub}$=−3 V the APD speed is significantly enhanced. Here, the gated diode vertical field at the drain side is approximately equal to −8.5 V, which corresponds to the drain junction breakdown voltage. It is also worth noting that for $V_{sub} \leq -3$ V, the threshold voltage of the cell converges to essentially the same voltage of ±volts. The significant enhancement in APD programming suggests that a significant supply of hot electrons could be provided if the cell was operated in the breakdown region. Thus, by controlling the vertical field, the cell could then be programmed or erased.

Figure 3:
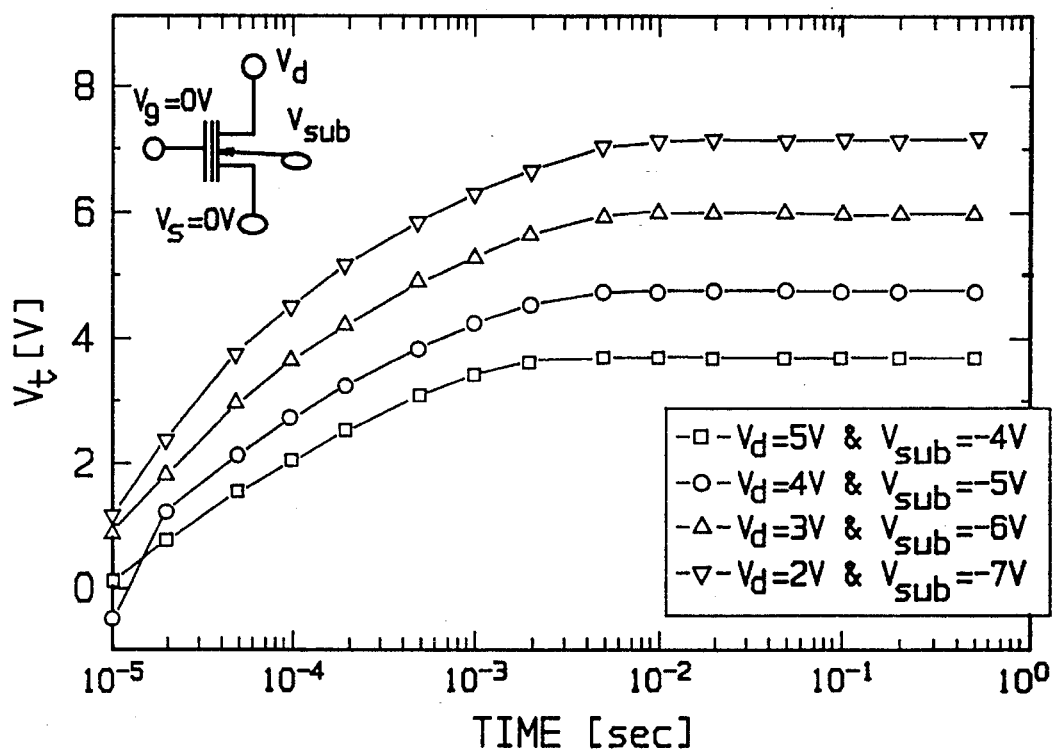
FIG. 3 illustrates the programming dependence on the drain bias under a fixed drain-to-substrate voltage.

To further demonstrate the programming dependence on the drain bias under a fixed drain-to-substrate voltage, the threshold voltages $V_t$ as a function of the APD time of the memory cell is plotted in FIG. 3 with the drain voltage and the substrate voltage as defined in the inset. As can be seen, the gated diode field (drain-to-substrate voltage $V_{d,sub}$) was maintained to be equal to +9 V with the varying drain voltage $V_d$. It can thus be seen that the value of the convergence threshold voltage is directly determined by the resultant vertical field, which is in turn governed by the drain-to-floating gate coupling ratios and the substrate voltage. Dependent on the bias condition, the cell can be erased (charged) or programmed (discharged).

Figure 4:
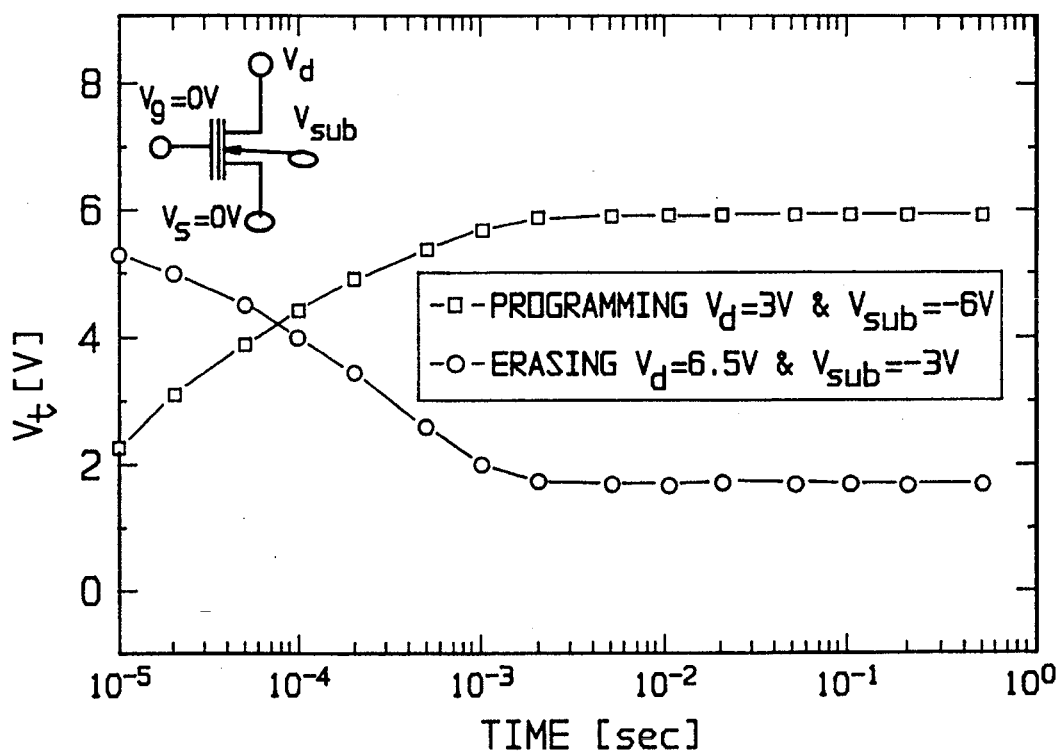
FIG. 4 depicts the program and erase characteristics, with the applied voltages on the inset.

The program and erase characteristics of the memory cell is shown in FIG. 4. In this case, the programming operation is accomplished by applying ∓V on the drain ($V_d$=3 V) and −6 V on the substrate ($V_{sub}$=−6 V) so as to shift upwardly the threshold voltage $V_t$ by 4 volts in approximately 0.002 seconds. Similarly, the erasing operation is achieved by applying +6.5 V on the drain ($V_d$=+6.5 V) and −3 V on the substrate ($V_{sub}$=−3 V) so as to shift downwardly the voltage threshold $V_t$ by 3 volts in 0.002 seconds. While erasing of the cell by only applying a high positive voltage on the drain and grounding the substrate is known in the art, this technique is limited in its application due to hot-hole injection during erase which causes variation in the erased threshold voltage of the cells in the memory array and thus degradation in its programmability.

However, it will be demonstrated presently that the inventive method of applying a negative to the substrate during programming will not inject hot-hole carriers to the interface and will reduce significantly the degradation in programmability. The reasons for the reduction in hot-hole injection are given as follows: (1) the location of the high field is away from the oxide silicon interface, (2) the magnitude of the maximum field is reduced by more than 50%, and (3) the vertical field does not favor hole injection.

Figure 5:
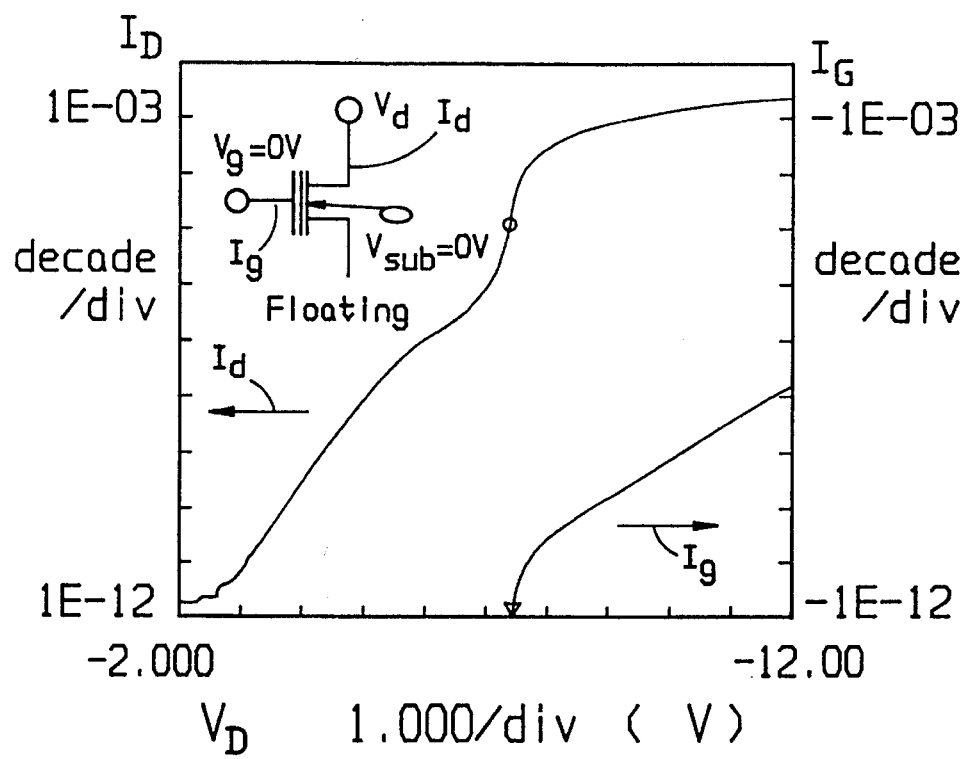
FIG. 5 shows the measured gated diode current and the negative gate current as a function of sweeping the drain voltage positively with the substrate grounded.
Figure 6:
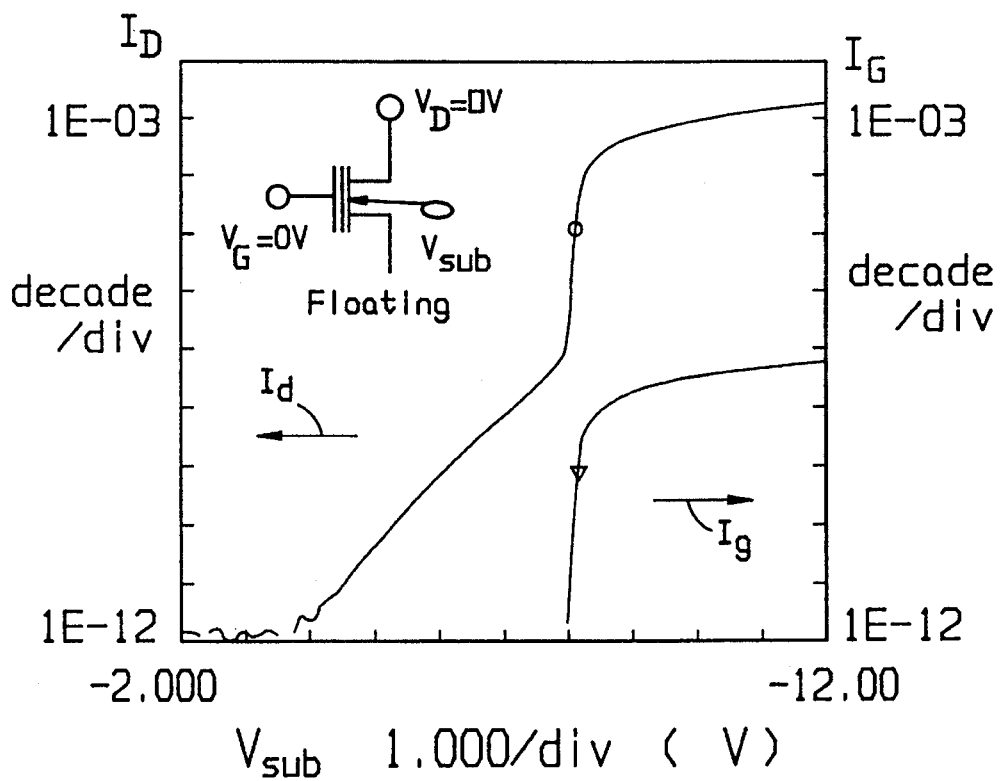
FIG. 6 shows the measured gated diode current and the positive gate current as a function of sweeping the substrate voltage negatively with the drain grounded.

In order to demonstrate that the threshold voltage $V_t$ distribution of the memory cell is improved significantly after programming and erase by its operation at the convergence point, measurements of the drain current $I_d$ and gate current $I_g$ were obtained by sweeping the voltage applied to the drain positively with the substrate being grounded, as is illustrated in FIG. 5. Also, the measurements of the drain current $I_d$ and the gate current $I_g$ were obtained by sweeping the voltage applied to the substrate negatively with the drain being grounded as depicted in FIG. 6. As can be seen from a comparison of FIGS. 6 and 5, by sweeping the substrate negatively, the junction breakdown voltage is only increased slightly, and the gate current dominated by electron injection is higher than the gate current dominated by hole injection with the sweeping of the drain voltage. Accordingly, it is believed that this enhanced electron gate current is the mechanism which enables fast programming (i.e., less than 10 μS). With the moderate high voltage applied to the drain during conventional programming, hot-carriers are generated close to the top surface of the substrate. In this case, the potential of the floating gate is lower than the drain bias so that the vertical field favors hot-hole injection thereby rendering severe degradation thereto. On the other hand, by applying a negative voltage to the substrate during programming in the present method, a breakdown will occur away from the top surface and thus the hot-hole induced oxide damage is significantly reduced as shown in FIG. 7(b).

Figure 7A:
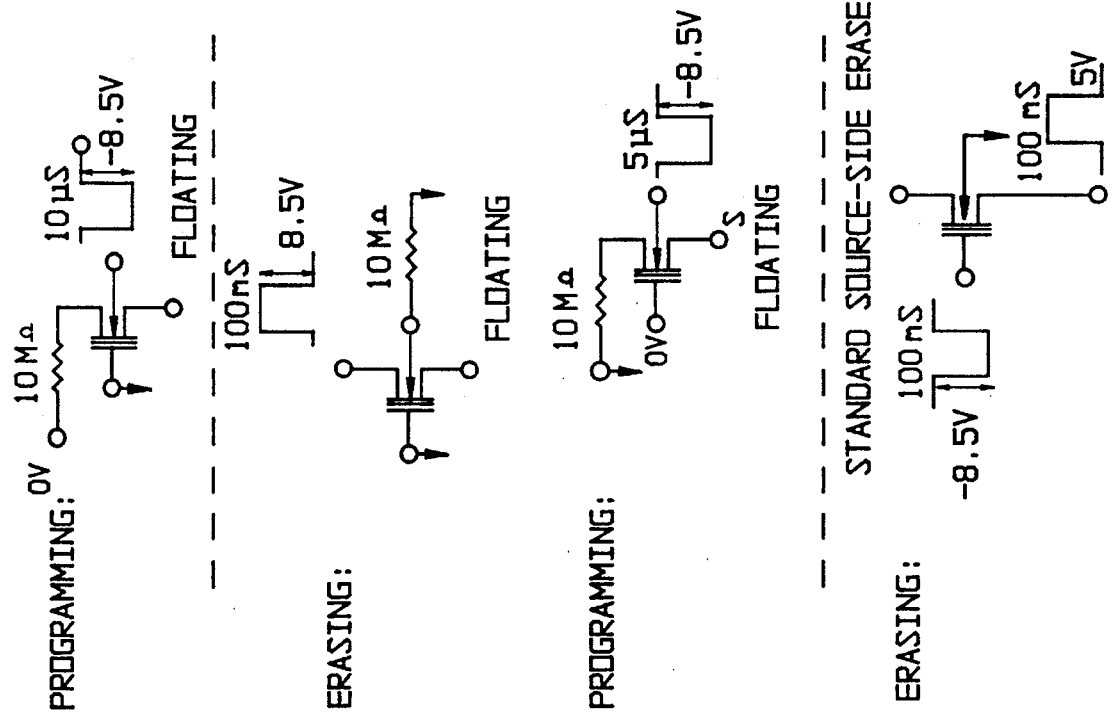
FIG. 7(a) illustrates the endurance characterization for flash programming and flash erasing in accordance with the present invention.
Figure 7A:
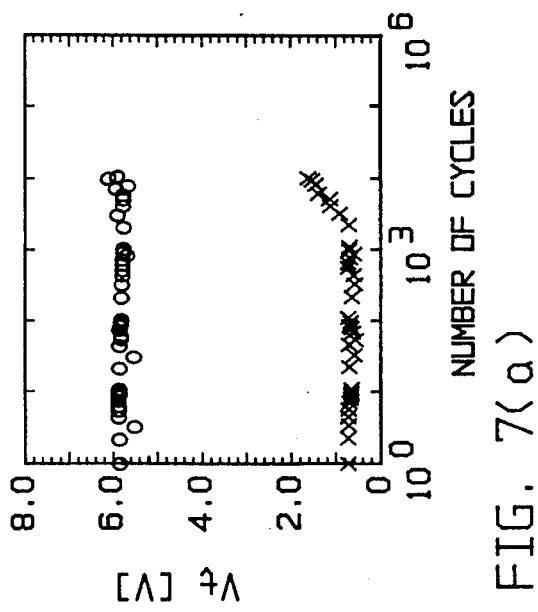
Figure 7B:
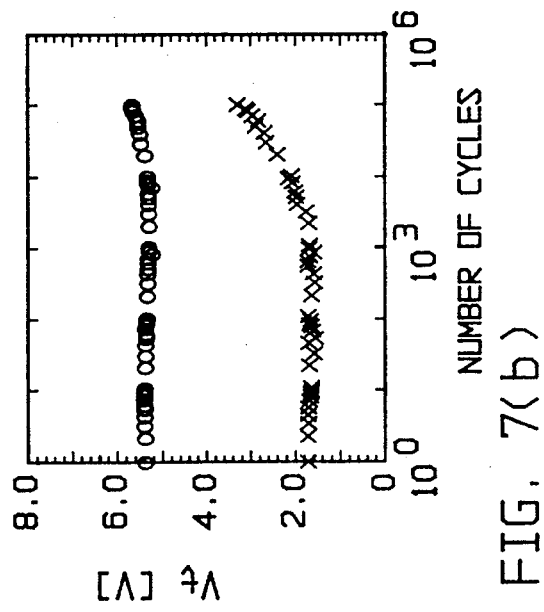
FIG. 7(b) illustrates the endurance characterization for standard source-side erasing and flash programming in accordance with the present invention.

Since endurance of a flash memory cell is one of the major concerns, the threshold voltage $V_t$ was measured as a function of the number of erase/programming cycles as shown in FIG. 7(a). The conventional or drain-side erase condition utilizing +8.5 V applied to the drain for 100 ms and zero volts applied to the control gate was used. The source was allowed to float. The flash programming condition of the present invention utilizing −8.5 V applied to the substrate for 10 μS and 0 V applied to the control gate and drain was performed. The source region was again allowed to float. It was observed that after 1,000 cycles the threshold voltage $V_t$ after programming and erase started to degrade. It should be pointed out that for certain applications, such as programmable logic memories, where endurance is only required up to 100 cycles this present method could be utilized which allows for fast charging (programming) and discharging (erasing) at relatively low operational voltage.

The endurance could be improved by optimizing the gate oxide using such as nitrided oxide or re-engineering the peak electric field region (or buried channel doping). In addition, thicker gate oxide (greater than 100 Å) could be used so as to improve endurance because the present method relies upon hot-carrier injection rather than by Fowler-Norheim tunneling.

In order to study the degradation dependence upon the voltage applied to the drain during programming, the memory cell was erased each time using the conventional source-side erase (i.e., −9 V on the control gate for 100 ms, and +5 V on the source for 100 ms with the drain floating). During programming, different voltages were applied to the drains but yet maintaining the same drain-to-substrate field. It was observed that the endurance of the memory cell was degraded approximately by one order of magnitude when the drain voltage $V_d$ was at $\geq +2$ V.

In view of performing the various experimentations described above, the inventors have now discovered the improved method for flash programming an array of flash EEPROM memory cells having a floating gate structure which is used in conjunction with the conventional source-side flash erase method could be improved significantly to provide an endurance of more than 100,000 cycles, as is illustrated in FIG. 7(b) per the inset. The operation of the electrically erasable and programmable read-only memory device will now be described in accordance with the present technique with reference to FIG. 7(b). The erasing operation is accomplished by applying −8.5 V to the control gate for 100 ms, +5 V to the source for 100 ms, and the drain being allowed to float. Thus, the erase condition is identical to that of the prior art which is referred to as the standard source-side erase.

In contrast, the programming operation is different from that of the prior art. This novel programming method according to the present invention is achieved by applying −8.5 V to the substrate for 5 μS, zero volts applied to the drain and control gate, and the source being allowed to float. The current requirement during programming is relatively small, on the order of 1 μA per cell, as compared to approximately 400 μA per cell for channel hot electron programming. In order to achieve this small current and reduced hot-carrier damage during breakdown, a 10 MΩ resistor is used in series with the drain. Because of this low current requirement, the high negative voltage applied to the substrate and gate during the respective programming and erase operations, can be generated internally on the same integrated circuit chip by a charge pump circuit that is connected to only a single, low voltage (5 Volt) power supply. Due to this low current per cell, this permits more than 1,000 cells (bits) be programmed simultaneously using approximately 1 mA. Further, the present flash programming and standard source-erase combination has a fast programming speed of less than 10 μS and a reliability of more than 100,000 cycles as illustrated in FIG. 7(b).

It should be clear to those skilled in the art that the novel bulk (or byte) programming (charging) method according to the present invention is equally applicable to the DINOR type cell architecture of FIG. 10 in order to achieve both program and erase speed within 100 μS or less. However, the bulk charging (referred to as erasing in the DINOR type architecture) will be done on the source side rather than on the drain side. In other words, the bulk charging is achieved by applying −8.5 V to the p-well for 5 uS, zero volts applied to the source and the control gate, and the drain being allowed to float. The n-well is also grounded.

Alternatively, the inventors have now also determined that this bulk charging can be achieved with positive voltages rather than using negative voltages. Specifically, for the DINOR type architecture the bulk charging is accomplished by applying +8.5 V to the source and to the control gate for 5 μS, zero volts applied to the p-well (substrate), and the drain being allowed to float. The n-well is applied with a positive intermediate voltage of approximately +5 V. Further, the bulk charging may be accomplished alternatively by applying zero volts to the p-well (substrate) and +8.5 V to the drain and to the control gate for the 5 μS, the source being allowed to float.

Figure 8:
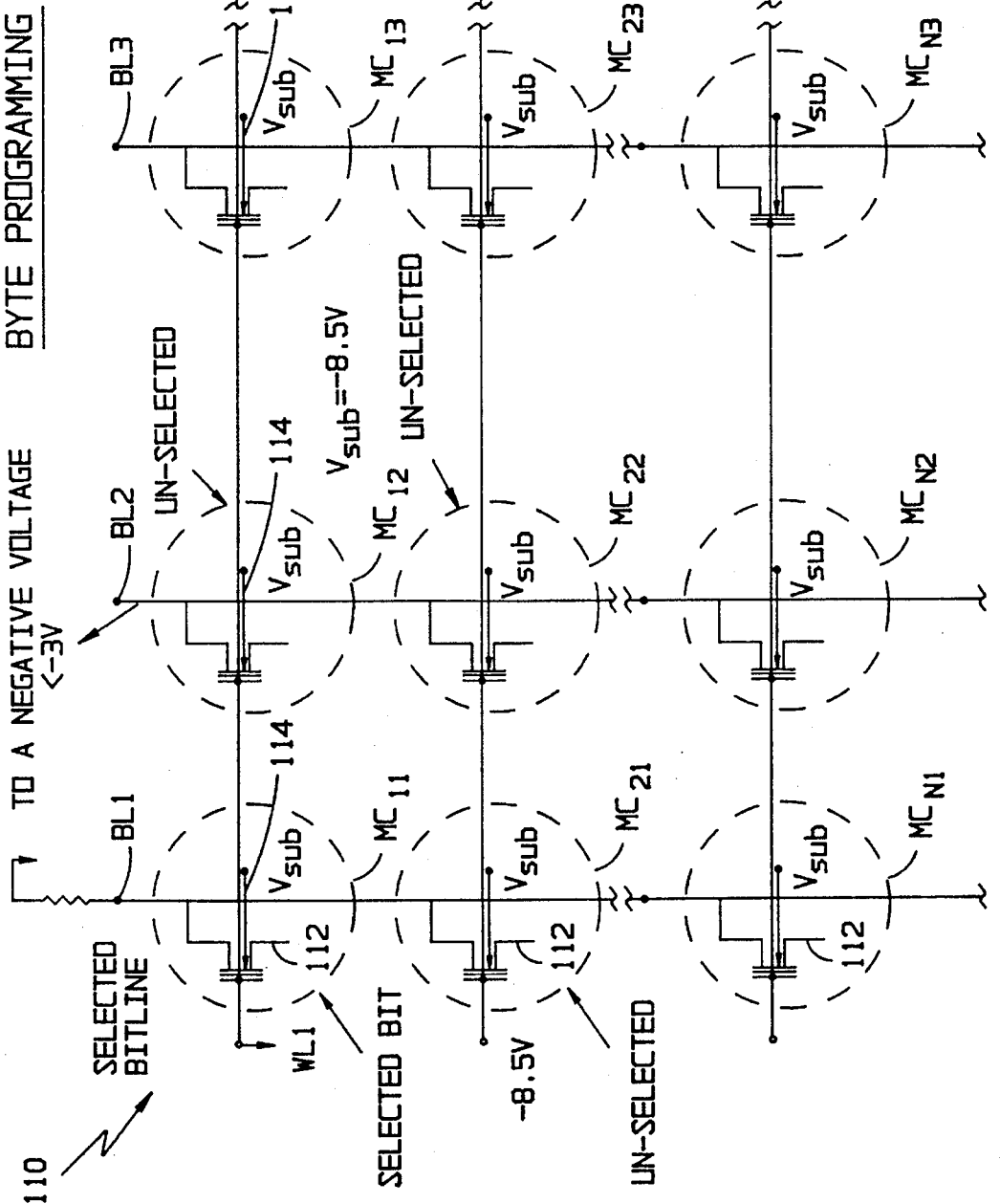
FIG. 8 is a schematic circuit diagram of a portion of a flash EEPROM array for byte programming in accordance with the invention.

The device structure and the flash programming/standard source-side erase method discussed above permits the formation of a high density (1 megabit) EEPROM array in which a large section of the array can be programmed simultaneously. Referring now to FIG. 8, an EEPROM array 110 of such devices is illustrated which can provide such high density. The array 110 is formed of a plurality of memory cells $MC_{11} \ldots MC_{NM}$, with N rows and M columns. The peripheral circuitry on the device includes conventional row address decoder, column address decoder, sense amplifier circuitry, and input/output buffer circuitry which have been purposely omitted for the sake of clarity.

It can be seen that the drains of the transistors in the same column ($MC_{11}$, $MC_{21}$, . . . ) are connected together and to a shared bit line (i.e., BL1) connectible to the column address decoder (not shown). The gates of the transistors in the same row (i.e., $MC_{11}$, $MC_{12}$, . . . ) are connected together and to a shared wordline (i.e., WL1). Further, sources of the transistors in the same row are connected together by a source line and then all of the source lines are joined together to a common source lead 112. Also, the substrates of the transistors in the same row are connected together by a substrate line and then all the substrate lines are joined together to a common substrate lead 114.

Due to the common source lead 112 in the array 110, erasing of the cells can be done on a whole array or a number of sectors (bulk erase) by utilizing the standard source-side erase method as previously described. For example, a negative voltage could be applied to all of the wordlines of the cells desired to be erased from the row address decoder (not shown). At the same time, a common source lead 112 could be raised to the positive voltage. Further, due to the common substrate lead 114 programming of the cells can be easily performed on a byte-by-byte basis (smaller segments of rows can be selectively programmed as desired).

In order to achieve this byte programming, the flash programming method of the present invention as previously described is used. In other words, the negative voltage would be applied to the substrate of the cells desired to be programmed by way of the common substrate lead 114. Simultaneously, the wordline containing the selected byte to be programmed would be held to a ground potential. Also, the bit lines containing the selected byte to be programmed would likewise be held to a ground potential. The common source lead 112 is allowed to float.

Figure 9:
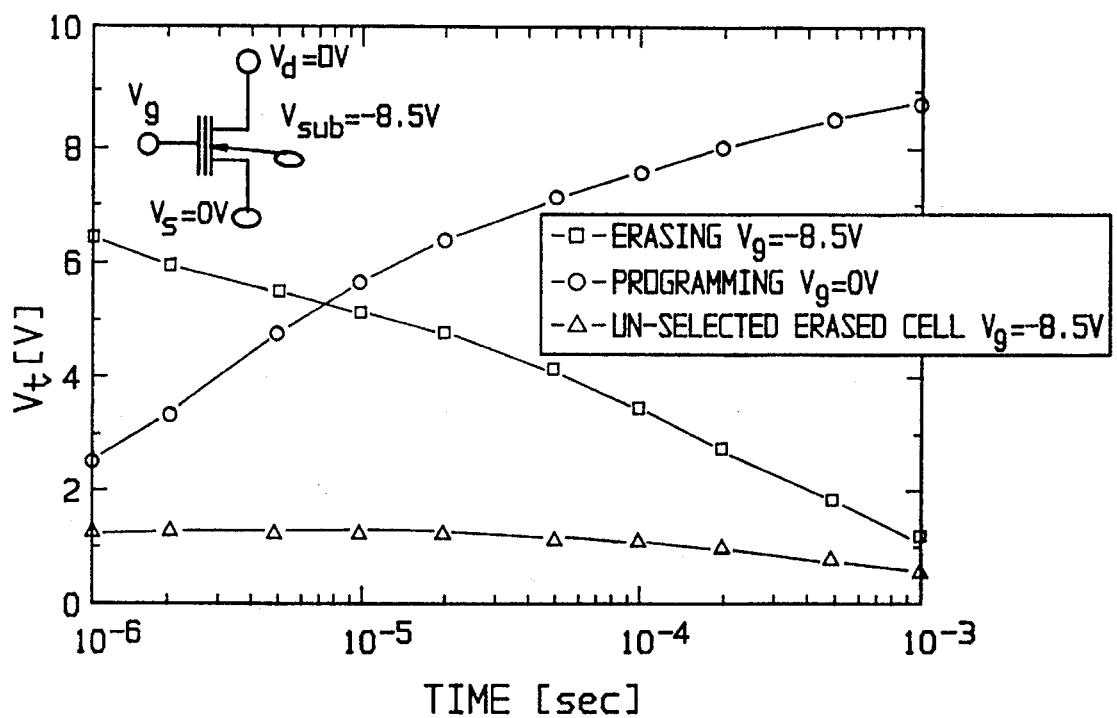
FIG. 9 shows the disturbance of the threshold voltages of a flash memory cell on the unselected word line during flash erase/byte programming in accordance with the invention.

However, since the substrate in the unselected cells are also supplied with the negative voltage and since the drains of the other unselected cells are floating, the contents of these unselected cells may be disturbed if the bit line capacitance is high. In the preferred embodiment, in order to insure that the data in the unselected bytes is not disturbed, all of the unselected wordlines are connected to the same negative voltage supply, $V_{sub}$, to inhibit program disturb of the unselected bytes. The byte programming and disturbance characteristic of the unselected wordlines is illustrated in FIG. 9. Further, in order to reduce the field below breakdown on the drain side of the unselected bit lines during programming, it would be preferable to suitably apply a negative voltage of approximately −3 V on the unselected lines and thus eliminate any disturbance.

From the foregoing detailed description, it should be appreciated that the improved performance of the present invention has been achieved by the combination of employing the standard source-side EEPROM or flash erase method for bulk erasing and employing the improved flash programming method of the instant invention for bulk (or byte) programming of the memory cells in an array. As a consequence, there is realized significant improvement over the previous EEPROM structure and method for programming the same. The present invention provides low current, fast programming which requires only a single, low voltage power supply. This is accomplished by applying a negative voltage to the substrate of the selected cells in the array and simultaneously applying zero volts to the drains and control gates thereof.

As an alternative, a positive bias configuration as mentioned above can be used to replace the negative bias configuration. This is because it is easier to design with positive voltages which could eliminate the need for a p-well.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A method for bulk (or byte) charging an array of flash EEPROM memory cells, said memory cells being formed on a substrate to define columns and rows, where the substrate includes a common source line extending along at least one of the rows, common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) charging steps of:

applying a negative voltage to the substrate of the array;

applying simultaneously a reference voltage of zero volts to drain regions of selected memory cells in the array that are to be programmed; and applying simultaneously the same reference voltage of zero volts to control gates of the selected memory cells, said source regions being allowed to float.

2. A method as claimed in claim 1, wherein said negative voltage is in the range of −6.0 V to −10 V.

3. A method as claimed in claim 2, wherein said negative voltage is approximately −8.5 V.

4. A method as claimed in claim 3, wherein said negative voltage is applied for less than 100 mS.

5. A method as claimed in claim 1, further including step of applying a current-limiting device in series with the drain regions so as to clamp drain current during programming and erase operations.

6. A method as claimed in claim 1, further including step of applying a programming-inhibiting voltage of a polarity and magnitude the same as voltage on the substrate to the control gates of non-selected memory cells in the array which are not to be programmed during said programming operation so as to insure against a disturbance.

7. A method as claimed in claim 6, further including step of applying a second negative voltage to drain regions of the non-selected memory cells so as to insure against a disturbance.

8. A method as claimed in claim 7, wherein said second negative voltage is approximately −3 V so as to reduce the field below breakdown and thus eliminate any disturbance.

9. A method as claimed in claim 1, wherein said source regions are allowed to float during flash programming.

10. A method for bulk (or byte) charging and source-side erasing an array of flash EEPROM memory cells, said memory cells being formed on a substrate to define columns and rows, where the substrate includes a common source line extending along at least one of the rows, a common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) charging steps of:

applying a first negative voltage to the substrate of the array;

applying simultaneously a reference voltage of zero volts to drain regions of selected memory cells in the array that are to be programmed;

applying simultaneously the same reference voltage of zero volts to control gates of the selected memory cells;

said method further including the source-side erasing steps of applying zero volts to the substrate of the array;

applying a positive voltage to the source regions of the array; and applying a second negative voltage to the control gates, said drain regions being allowed to float during erasure.

11. A method as claimed in claim 10; wherein said first negative voltage is in the range of −6.0 V to −10 V.

12. A method as claimed in claim 11, wherein said first negative voltage is approximately −8.5 V.

13. A method as claimed in claim 12, wherein said first negative voltage is applied for less than 10 μS.

14. A method as claimed in claim 13, further including step of applying a current-limiting device in series with the drain regions so as to clamp drain current during programming and erase operations.

15. A method as claimed in claim 10, further includes step of applying a programming-inhibiting voltage of a polarity and magnitude the same as voltage on the substrate to control gates of non-selected memory cells in the array which are not to be programmed during said programming operation so as to insure against a disturbance.

16. A method as claimed in claim 15, further including step of applying a third negative voltage to drain regions of the non-selected memory cells so as to insure against a disturbance.

17. A method as claimed in claim 16, wherein said third negative voltage is approximately −3 V so as to reduce the field below breakdown and thus eliminate any disturbance.

18. A method as claimed in claim 10, wherein said source regions are allowed to float during flash programming.

19. A method for bulk (or byte) charging and flash erasing an array of flash EEPROM memory cells, said memory cells being formed on a substrate to define columns and rows, where the substrate includes a common source line extending along at least one of the rows, a common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) charging steps of:

applying a negative voltage to the substrate of the array;

applying simultaneously a reference voltage of zero volts to drain regions of selected memory cells in the array that are to be programmed;

applying simultaneously the same reference voltage of zero volts to control gates of the selected memory cells;

said method further including the flash erasing steps of applying a positive voltage the same magnitude as voltage on said substrate during flash programming to the drain regions of the array; and applying the zero volts the same as that of said drain region during flash programming operations to the control gate and substrates of the array, said source regions being allowed to float during erasure.

20. A method as claimed in claim 19, further includes step of applying a programming-inhibiting voltage of a polarity and magnitude the same as voltage on the substrate to the control gates of non-selected memory cells in the array which are not to be programmed during said flash programming operations so as to insure against a disturbance.

21. A method for bulk (or byte) charging an array of flash EEPROM memory cells, said memory cells being formed on a substrate to define columns and rows, where the substrate includes common source line extending along at least one of the rows, a common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) charging steps of:

applying a reference voltage of zero volts to the substrate of the array;

applying simultaneously a positive voltage to drain regions of selected memory cells in the array that are to be programmed; and applying simultaneously the same positive voltage to control gates of the selected memory cells, said source regions being allowed to float.

22. A method for bulk (or byte) charging an array of flash EEPROM memory cells, said memory cells being formed on a substrate to define columns and rows, where the substrate includes common source line extending along at least one of the rows, a common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) charging steps of:

applying a reference voltage of zero volts to the substrate of the array;

applying simultaneously a positive voltage to source regions of selected memory cells in the array that are to be programmed; and applying simultaneously the same positive voltage to control gates of the selected memory cells, said drain regions being allowed to float.

23. A method for bulk (or byte) discharging an array of flash EEPROM memory cells, said memory cells being formed on a substrate to define columns and rows, where the substrate includes a common source line extending along at least one of the rows, a common substrate line, and a plurality of bit lines extending along respective columns, where each memory cell includes an n-type source region coupled to the common source line, a control gate, a floating gate, a channel region, and an n-type drain region coupled to a respective one of the bit lines, said method comprising the bulk (or byte) discharging steps of:

applying a low negative voltage to the substrate of the array;

applying simultaneously an intermediate positive voltage to drain regions of selected memory cells in the array that are to be erased; and applying simultaneously a reference voltage of zero volts to control gates of the selected memory cells, said source regions being allowed to float.

* * * * *

UNITED STATES PATENT AND TRADEMARK OFFICE
CERTIFICATE OF CORRECTION

PATENT NO. : 5,491,657
DATED : February 13, 1996
INVENTOR(S) : Sameer S. Haddad et al.

It is certified that error appears in the above-indentified patent and that said Letters Patent is hereby corrected as shown below:

Column 2, line 25, change "‡" to -- +3 --.
Column 6, line 16, change "‡" to -- +3 --;
       line 38, change "‡" to -- +3 --.

Signed and Sealed this

Fourteenth Day of May, 1996

Attest:

BRUCE LEHMAN

*Attesting Officer*     *Commissioner of Patents and Trademarks*